(12) United States Patent
Wang et al.

(10) Patent No.: US 10,211,106 B2
(45) Date of Patent: Feb. 19, 2019

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventors: Ming Wang, Shanghai (CN); Qiancheng Ma, Shanghai (CN); Yong Cheng, Shanghai (CN); Lihua Teng, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/806,191

(22) Filed: Nov. 7, 2017

(65) Prior Publication Data

US 2018/0061713 A1    Mar. 1, 2018

Related U.S. Application Data

(62) Division of application No. 14/532,624, filed on Nov. 4, 2014, now Pat. No. 9,824,928.

(30) Foreign Application Priority Data

Dec. 31, 2013  (CN) .......................... 2013 1 0754079

(51) Int. Cl.
*H01L 27/07*    (2006.01)
*H01L 21/8234*  (2006.01)
*H01L 29/66*    (2006.01)
*H01L 29/78*    (2006.01)
*H01L 29/06*    (2006.01)
*H01L 29/872*   (2006.01)
*H01L 29/47*    (2006.01)

(52) U.S. Cl.
CPC .. *H01L 21/823418* (2013.01); *H01L 27/0727* (2013.01); *H01L 29/0638* (2013.01); *H01L 29/66659* (2013.01); *H01L 29/7835* (2013.01); *H01L 29/0619* (2013.01); *H01L 29/0653* (2013.01); *H01L 29/47* (2013.01); *H01L 29/66143* (2013.01); *H01L 29/872* (2013.01)

(58) Field of Classification Search
CPC ........... H01L 29/782; H01L 21/823418; H01L 29/0638; H01L 29/7835; H01L 29/66659; H01L 27/0727; H01L 29/0653; H01L 29/47; H01L 29/0619; H01L 29/872; H01L 29/66143
See application file for complete search history.

(56) References Cited

U.S. PATENT DOCUMENTS

6,784,489 B1    8/2004   Menegoli
7,064,407 B1    6/2006   Mallikarjunaswamy
(Continued)

*Primary Examiner* — Latanya N Crawford
(74) *Attorney, Agent, or Firm* — Innovation Counsel LLP (57) ABSTRACT

A semiconductor device may include a first-type substrate. The semiconductor device may further include a second-type well configured to form a PN junction with the first-type substrate. The semiconductor device may further include a diode component configured to form a diode with the second-type well. The diode may be connected to the PN junction in a reverse series connection. The second-type may be N-type if the first-type is P-type, and wherein the second-type may be P-type if the first-type is N-type.

12 Claims, 7 Drawing Sheets

(56) References Cited

U.S. PATENT DOCUMENTS

| | | |
|---|---|---|
| 7,608,907 B2 | 10/2009 | Mallikarjunaswamy |
| 7,699,626 B2 | 4/2010 | Lu et al. |
| 8,008,970 B1 | 8/2011 | Homol |
| 8,018,021 B2 | 9/2011 | Kim |
| 8,653,535 B2 | 2/2014 | Kudo |
| 9,231,083 B2 | 1/2016 | Yang |
| 2008/0293205 A1 | 11/2008 | Kwon |
| 2010/0327343 A1 | 12/2010 | Salcedo |
| 2011/0298280 A1 | 12/2011 | Homol |
| 2013/0082285 A1 | 4/2013 | Kudo |
| 2013/0270606 A1 | 10/2013 | Chen |

SEMICONDUCTOR DEVICE, RELATED MANUFACTURING METHOD, AND RELATED ELECTRONIC DEVICE

CROSS-REFERENCE TO RELATED APPLICATION

This is a divisional of U.S. application Ser. No. 14/532,624 filed on Nov. 4, 2014, which application claims priority to and benefit of Chinese Patent Application No. 201310754079.2, filed on Dec. 31, 2013, the disclosures of each of which are incorporated herein by their reference.

BACKGROUND OF THE INVENTION

The present invention is related to a semiconductor device, a method for manufacturing the semiconductor device, and an electronic device that includes the semiconductor device.

In semiconductor devices, laterally diffused metal oxide semiconductor (LDMOS) transistor devices may have desirable performance characteristics, such as desirable thermal stability, frequency stability, durability, etc. Therefore, LDMOS transistor devices have been widely used in code division multiple access (CDMA) devices, wideband code division multiple access (WCDMA) devices, digital televisions, etc.

Figure 1:
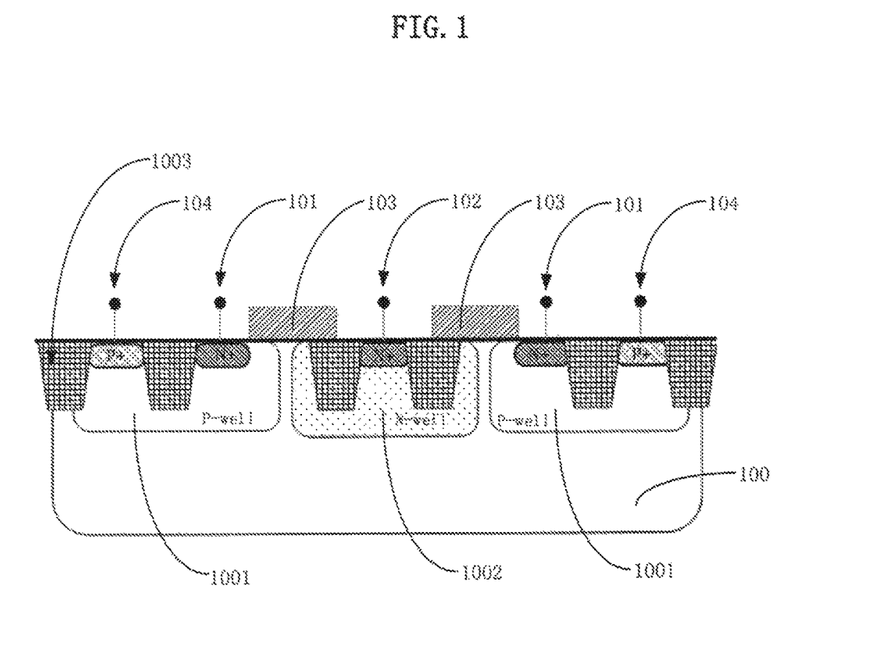
FIG. 1 shows a schematic cross-sectional view that illustrates structures of an LDMOS transistor device (or LDMOS device).

FIG. 1 shows a schematic cross-sectional view that illustrates structures of an LDMOS transistor device (or LDMOS device). The LDMOS device may include the following elements: a P-type substrate 100, a P-well 1001 formed in the P-type substrate 100, an N-well 1002 formed in the P-type substrate 100, an N-type source electrode 101 (or source 101) positioned in the P-well 1001, an N-type drain electrode 102 (or drain 102) positioned in the N-well 1002, a gate electrode 103 (or gate 103) positioned on the P-type substrate 100, a P-type body electrode 104 positioned in the P-well 1001, and a shallow trench isolation (STI) element 1003 positioned in the P-type substrate. Each of the source electrode 101, the gate electrode 103, and the body electrode 104 may have a ring-shaped structure and may surround the drain electrode 102 in a plan view of the LDMOS device.

In the LDMOS device, the drain electrode 102 may be used as a pickup region that is electrically connected to an inductive load through an ohmic contact, such that the LDMOS device may be used in an inductive load mode. When a negative pulse caused by the inductive load is applied to the drain electrode 102, forward conduction may be provided at the PN junction formed by the P-type substrate 100 and the N-well 1002. As a result, a large electric current may undesirably flow into the P-type substrate, such that the performance of the LDMOS device may be adversely affected.

SUMMARY

An embodiment of the present invention may be related to a semiconductor device that may include a first-type substrate. The semiconductor device may further include a second-type well configured to form a PN junction together with (or in cooperation with) the first-type substrate. The semiconductor device may further include a diode component configured to form a diode together with (or in cooperation with) the second-type well. The diode may be electrically connected to the PN junction in a reverse (or reverse-bias) series connection. The second-type may be (or represent) N-type if the first-type is (or represents) P-type, and wherein the second-type may be (or represent) P-type if the first-type is (or represent) N-type.

The diode may effectively block an electric current from undesirably substantially flowing into the first-type substrate when a laterally diffused metal oxide semiconductor (LDMOS) transistor structure of the semiconductor device operates in an inductive load mode; therefore, the semiconductor device may function properly. Advantageously, desirable quality and/or performance of the semiconductor device may be substantially ensured and/or attained.

The diode may be a Schottky diode. The second-type well may be positioned between the diode component and the first-type substrate. The diode component may be a metal-containing element. The diode component may be a metal silicide element.

An end portion (e.g., a top portion and/or a top surface) of the diode component may not directly contact the second-type well and may function as a drain electrode region of a transistor structure, e.g., an LDMOS transistor structure, of the semiconductor device.

The semiconductor device may include a conductive element configured to function as a gate electrode of a transistor structure. The diode component may be positioned between two portions of the conductive element and/or may be surrounded by the conductive element.

The semiconductor device may include a second-type element configured to function as a source electrode of a transistor structure. The diode component may be positioned between two portions of the second-type element and/or surrounded by the second-type element in a plan view of the semiconductor device.

The semiconductor device may include a first-type element configured to function as a body electrode of a transistor structure. The diode component may be positioned between two portions of the first-type element and/or surrounded by the first-type element in a plan view of the semiconductor device.

The semiconductor device may include a first-type ion implanted region positioned in the second-type well.

A portion of the second-type well may be positioned between the first-type ion implanted region and a surface (e.g., a bottom surface) of the first-type substrate in a direction perpendicular to the surface of the first-type substrate.

A portion of the second-type well that overlaps the diode component may be positioned between two portions of the first-type ion implanted region and/or surrounded by first-type ion implanted region.

The semiconductor device may include a conductive element configured to function as a gate electrode of a transistor structure. The first-type ion implanted region may be positioned between two portions of the conductive element and/or surrounded by the conductive element in a plan view of the semiconductor device.

The semiconductor device may include a second-type element configured to function as a source electrode of a transistor structure. The first-type ion implanted region may be positioned between two portions of the second-type element and/or surrounded by the second-type element.

The semiconductor device may include a first-type element configured to function as a body electrode of a transistor structure. The first-type ion implanted region may be positioned between two portions of the first-type element and/or surrounded by the first-type element.

An embodiment of the invention may be related to a method for manufacturing a semiconductor device. The method may include the following steps: preparing a first-type substrate; implementing a second-type well that forms a PN junction with the first-type substrate; and implementing a diode component that forms a diode with the second-type well. The diode may be electrically connected to the PN junction in a reverse (or reverse-bias) series connection. The second-type may be (or represent) N-type if the first-type is (or represents) P-type, and the second-type may be (or represent) P-type if the first-type is (or represents) N-type.

The diode component may be a metal-containing element and/or may be a metal silicide element.

The method may include implanting a first set of first-type ions to form a first-type ion implanted region in the second-type well.

The method may include implanting a second set of first-type ions in a first-type well to form a body electrode of a transistor structure. The first-type ion implanted region may be positioned between two portions of the body electrode of the transistor structure and/or surrounded by the body electrode of the transistor structure.

The second set of first-type ions may be implanted when the first set of first-type ions is being implanted.

An embodiment of the invention may be related to an electronic device that includes a semiconductor device. The semiconductor device may include the following elements: a first-type substrate; a second-type well configured to form a PN junction with the first-type substrate; and a diode component configured to form a diode with the second-type well. The diode may be electrically connected to the PN junction in a reverse (or reverse-bias) series connection. The second-type may be (or represent) N-type if the first-type is (or represents) P-type, and the second-type may be (or represent) P-type if the first-type is (or represents) N-type.

The above summary is related to one or more of many embodiments of the invention disclosed herein and is not intended to limit the scope of the invention.

DETAILED DESCRIPTION

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 2:
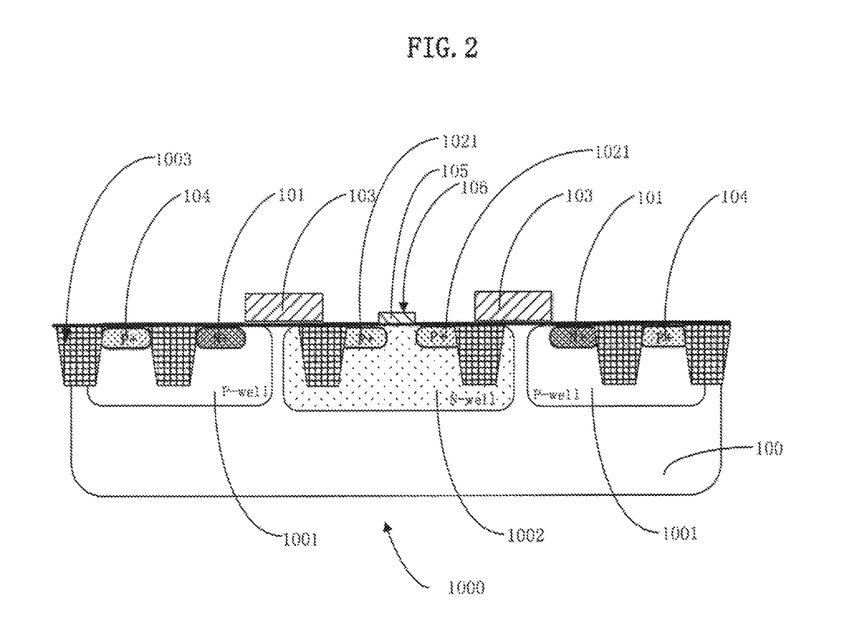
FIG. 2 shows a schematic cross-sectional view that illustrates structures of a semiconductor device in accordance with an embodiment of the present invention.

FIG. 2 shows a schematic cross-sectional view that illustrates structures of a semiconductor device 1000 in accordance with an embodiment of the present invention. The semiconductor device 1000 may include one or more LDMOS transistor elements and/or structures analogous to one or more LDMOS transistor elements and/or structures discussed with reference to FIG. 1.

As illustrated in FIG. 2, an LDMOS structure of the semiconductor device 1000 may include the following elements: a P-type substrate 100, a P-well 1001 formed in the P-type substrate 100, an N-well 1002 (which may serve as a drift region of the semiconductor device 1000) formed in the P-type substrate 100, an N-type source electrode 101 (or source 101) doped with N-type ions and positioned in the P-well 1001, a gate electrode 103 (or gate 103) positioned on the P-type substrate 100, a P-type body electrode 104 doped with P-type ions and positioned in the P-well 1001, and one or more shallow trench isolation (STI) elements 1003 positioned in the P-well 1001, the N-well 1002, and/or the P-type substrate. Each of the source electrode 101, the gate electrode 103, and the body electrode 104 may have a ring-shaped structure. The STI elements 1003 may isolate (and/or insulate) different elements in the LDMOS transistor structure, such that the performance of the LDMOS transistor structure may be enhanced.

The semiconductor device 1000 may include a diode component, e.g., a metal silicide element 105, positioned on and contacting the N-well 1002, wherein the N-well 1002 may serve as a drift region of the semiconductor device 1000. An end portion (e.g., a top portion or a top surface) of the metal silicide element 105 that does not directly contact the N-well 1002 may function as a drain electrode region 106 (or drain 106) of the LDMOS transistor structure of the semiconductor device 1000. The metal silicide element 105 (and the drain 106) may be surrounded by the gate electrode 103 and/or may be positioned between two portions of the gate electrode 103. In a plan view of the semiconductor device 1000, the metal silicide element 105 (and the drain 106) may be surrounded by at least one of the source electrode 101 and the body electrode 104, may be positioned between two portions of the source electrode 101, and/or may be positioned between two portions of the body electrode 104. The metal silicide element 105 and the N-well 1002 (i.e., a drift region) may form a Schottky diode. The Schottky diode may be formed using one or more known methods. The Schottky diode (formed at the drain 106 of the LDMOS transistor structure) may be electrically connected to the PN junction formed by the P-type substrate and the N-well 1002 in a reverse series. In other words, the Schottky diode and the PN junction may form a reverse series structure against unwanted electric current flow.

When the drain 106 is electrically connected to an inductive load (e.g., through metal silicide of the metal silicide element 105), the Schottky diode formed by the metal silicide element 105 and the N-well 1002 may effectively prevent a large electric current from substantially flowing into the P-type substrate 100. In an embodiment, if a negative voltage caused by the inductive load is applied to the drain 106, the Schottky diode formed by the metal silicide element 105 and the N-well 1002 may be in a reverse blocking mode to effectively block a large electric current from substantially flowing into the P-type substrate 100. If a positive voltage is applied to the drain 106, the Schottky diode formed by the metal silicide element 105 and the N-well 1002 may be in a forward conduction mode, such that the positive voltage may be substantially conducted and applied to the N-well 1002, i.e., the drift region of the DMOS transistor structure, for the LDMOS transistor structure to function normally.

The semiconductor device 1000 may include a P-type ion-implanted region 1021 positioned in the N-well 1002. The P-type ion-implanted region 1021 may have a ring-shaped structure that may surround a portion of the N-well 1002 that overlaps the metal silicide element 105 in a direction perpendicular to a surface (e.g., a bottom surface) of the P-type substrate 100. The P-type ion-implanted region 1021 may be surrounded by at least one of the source electrode 101, the body electrode 104, and an STI element 1003. The P-type ion-implanted region 1021 may be positioned between two portions of the source electrode 101. The P-type ion-implanted region 1021 may be positioned between two portions of the body electrode 104. In a plan view of the semiconductor device 1000, the P-type ion-implanted region 1021 may be surrounded by the gate electrode 103 and/or may be positioned between two portions of the gate electrode 103. A portion of the N-well 1002 may be positioned between the P-type ion-implanted region 1021 and a portion of the P-type substrate 100; the P-type ion-implanted region 1021 may be positioned between the portion of the N-well 1002 and the metal silicide element 105. In an embodiment, the P-type ion-implanted region 1021 may contact the metal silicide element 105. In an embodiment, the P-type ion-implanted region 1021 may overlap the metal silicide element 105 (and the drain electrode region 106) in a direction perpendicular to a surface (e.g., a bottom surface) of the P-type substrate 100. In an embodiment, the P-type ion-implanted region 1021 may not contact the metal silicide element 105. The P-type ion-implanted region 1021 may enable reduction or minimization of leakage when the aforementioned Schottky diode is in the reverse blocking mode, for enhancing the performance of the Schottky diode in blocking an electric current from substantially flowing into the P-type substrate 100.

Embodiments of the invention are substantially different from the LDMOS transistor structure illustrated in FIG. 1. In the LDMOS transistor structure illustrated in FIG. 1, the drain 102 may be electrically connected to an inductive load through an ohmic contact. In contrast, the drain 106 (i.e., the top portion of the metal silicide element 105) may be electrically connected to an inductive load (and/or other elements) through a Schottky diode.

In an embodiment, in addition to aforementioned elements in the LDMOS transistor structure and/or the Schottky diode structure, the semiconductor device 1000 may include one or more other elements, such as one or more of a regular metal oxide semiconductor (MOS) element, a complementary metal oxide semiconductor (CMOS) element, an inductor, a resistor, and a capacitor.

In an embodiment, the semiconductor device 1000 may include a diode of a different type instead of the aforementioned Schottky diode. The diode may substantially minimize electric current that flows into the P-type substrate 100. In one or more embodiments, a Schottky diode may be more effective in blocking an unwanted current flow than a non-Schottky diode.

In an embodiment, the P-type substrate 100 may be a standalone substrate.

In an embodiment, the P-type substrate 100 may be a portion of a composite substrate, such as a portion of a silicon-on-insulator (SOI) substrate.

According to embodiments of the invention, a semiconductor device 1000 may include a diode (e.g., a Schottky diode) that is positioned at (e.g., overlaps) a drain of an LDMOS transistor structure of the semiconductor device 1000 and is in a reverse (or reverse-bias) series connection with the PN junction formed by a P-type substrate and an N-type well of the LDMOS transistor structure. The diode may effectively block an unwanted electric current from substantially flowing into the P-type substrate when the LDMOS transistor structure operates in an inductive load mode, such that the semiconductor device may function properly. Advantageously, desirable quality and/or performance of the semiconductor device 1000 may be attained.

In an embodiment, alternative or in addition to the P-type substrate 100, a semiconductor device may include an N-type substrate and may include alternative or additional configurations (e.g., doping configurations) of wells and elements. For example, the source 101, the body electrode 104, and/or the ion-implanted region 1021 may have one or more doping configurations different from one or more of the doping configurations discussed with reference to the example of FIG. 2. The semiconductor device may include a diode (e.g., a Schottky diode) that is positioned at (e.g., overlapping) a drain of an LDMOS transistor structure of the semiconductor device and is in a reverse series connection with the PN junction formed by the N-type substrate and a P-type well of the LDMOS transistor structure. The diode may effectively block an electric current from substantially flowing toward the N-type substrate when the LDMOS transistor structure operates in an inductive load mode. Advantageously, desirable quality and/or performance of the semiconductor device may be achieved.

Figure 3A:
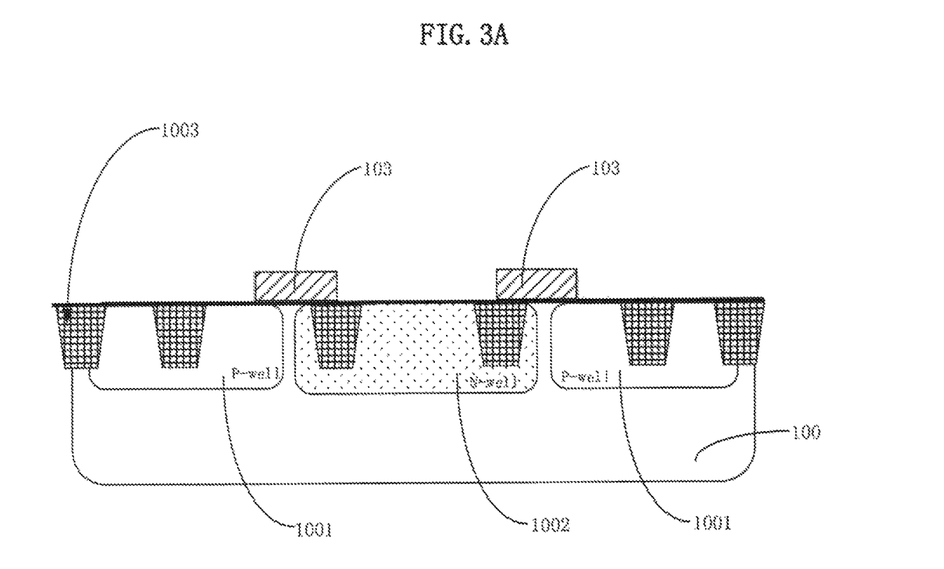
FIG. 3A, FIG. 3B, and FIG. 3C show schematic cross-sectional views that illustrate structures formed in a method for manufacturing a semiconductor device in accordance with an embodiment of the present invention.
Figure 3B:
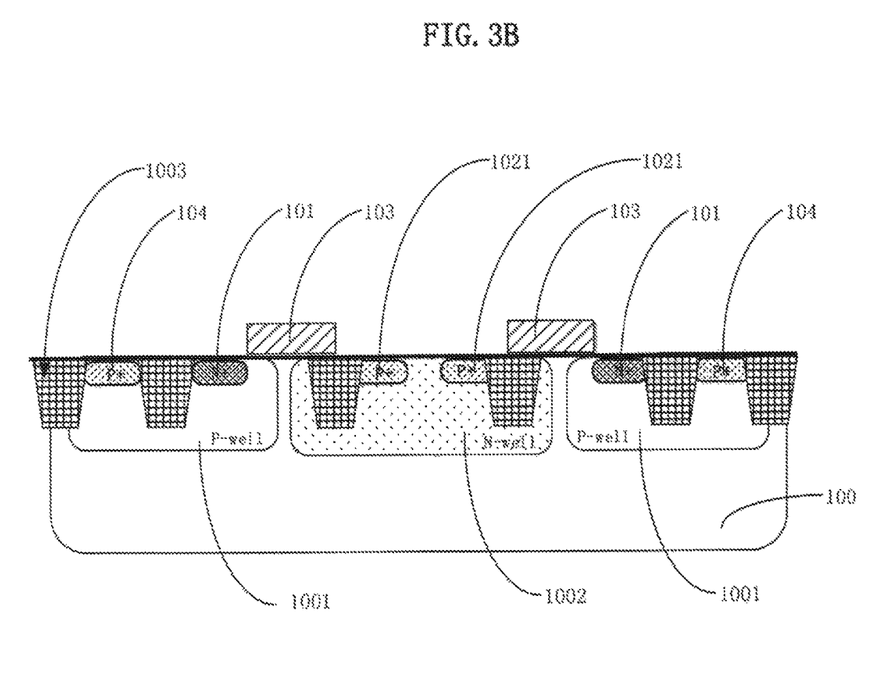
Figure 3C:
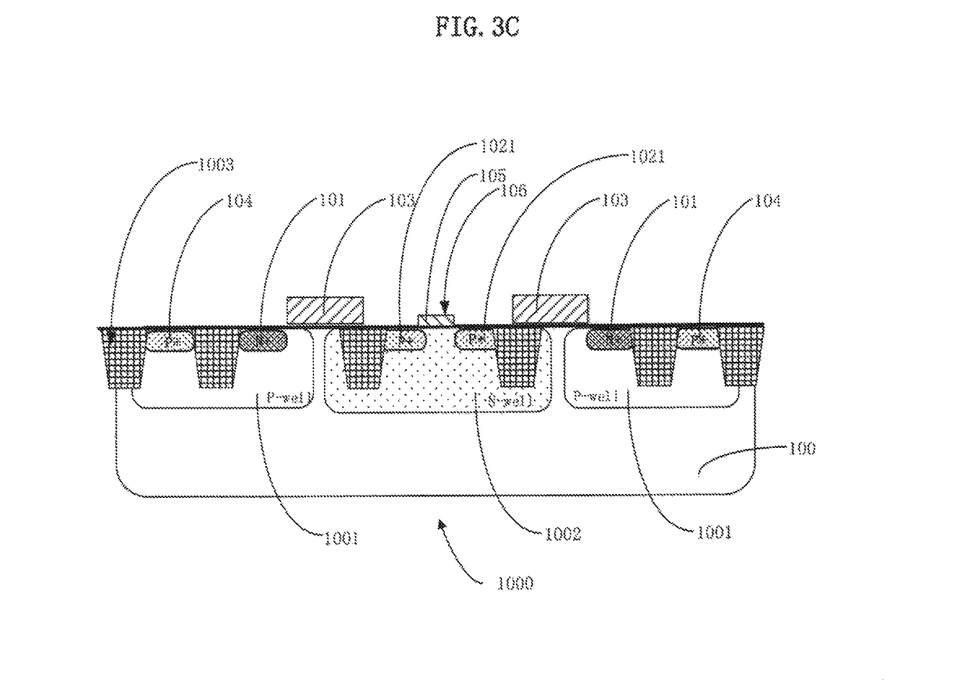
Figure 4:
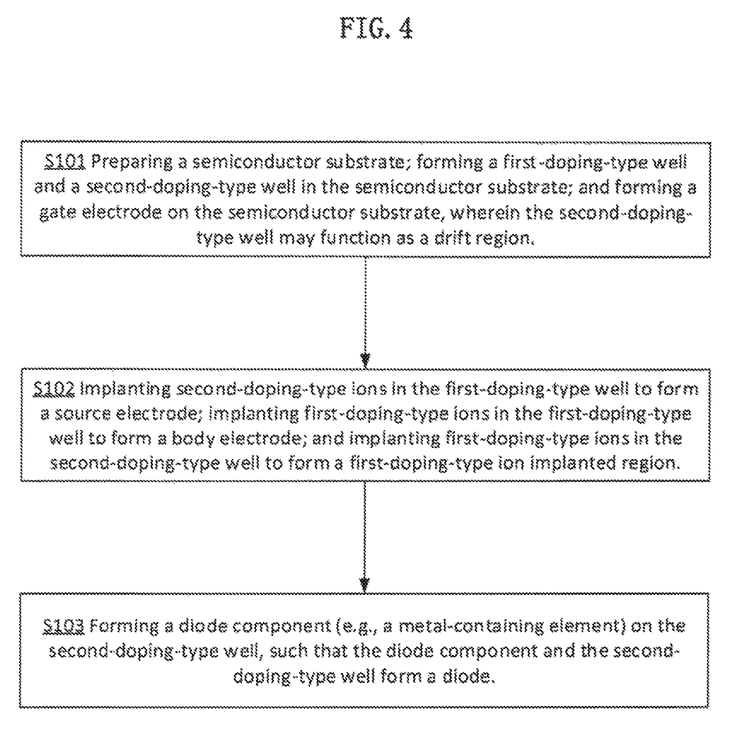
FIG. 4 shows a flowchart that illustrates a method for manufacturing a semiconductor device in accordance with an embodiment of the present invention.

FIG. 3A, FIG. 3B, and FIG. 3C show schematic cross-sectional views that illustrate structures formed in a method for manufacturing a semiconductor device 1000 that includes an LDMOS transistor structure in accordance with an embodiment of the present invention. FIG. 4 shows a flowchart that illustrates a method for manufacturing a semiconductor device, for example, the semiconductor device 1000 related to FIGS. 3A, 3B, and 3C, in accordance with an embodiment of the present invention.

Referring to FIG. 4, the method may include a step S101, a step S102, and a step S103.

The step S101 may include preparing a semiconductor substrate, e.g., the P-type substrate 100 illustrated in FIG. 3A. The semiconductor substrate may be a standalone substrate or a portion of a composite substrate (e.g., a portion of an SOI substrate). The step 101 may further include forming a first-doping-type well and a second-doping-type well in the semiconductor substrate. The first-doping-type may be different from the second-doping-type. For example, the first-doping-type well and the second-doping-type well may be the P-well 1001 and the N-well, respectively, illustrated in FIG. 3A. The step S101 may further include forming a conductive element (which may function as a gate electrode of the LDMOS transistor) on the semiconductor substrate. For example, the conductive element may be the gate electrode 103 formed on the P-type substrate 100 illustrated in FIG. 3A. The second-doping-type well may functions as a drift region of the LDMOS transistor structure. The step S101 may further include forming one or more shallow trench isolation (STI) elements, e.g., STI elements 1003 illustrated in FIG. 3A, in the semiconductor substrate. The step S101 may include forming one or more other elements and/or structures in or on one of more of the semiconductor substrate, the first-doping-type well, and the second-doping-type well.

The step S102 may include implanting second-doping-type ions in the first-doping-type well, e.g., the P-well 1001 illustrated in FIG. 3B, to form a second-type doped region (which may function as a source electrode of the LDMOS transistor structure) in the first-doping-type well. For example, the second-type doped region may be the N-type source electrode 101 illustrated in FIG. 3B. The step S102 may further include implanting a first set of first-doping-type ions in the first-doping-type well, e.g., the P-well 1001 illustrated in FIG. 3B, to form a first-type doped region (which may function as a body electrode of the LDMOS transistor structure) in the first-doping-type well. For example, the first-type doped region may be the P-type body electrode 104 illustrated in FIG. 3B. The step S102 may further include implanting a second set of first-doping-type ions in the second-doping-type well, e.g., the N-well 1002 illustrated in FIG. 3B, to form a first-doping-type ion implanted region, e.g., the P-type ion implanted region 1021 illustrated in FIG. 3B.

The implantation of the second-doping-type ions, the implantation of the first set of the first-doping-type ions, and the implantation of the second set of the first-doping-type ions may be performed in various sequences according to various embodiments. In an embodiment, the implantation of the first set of the first-doping-type ions and the implantation of the second set of the first-doping-type ions may be performed substantially simultaneously, performed in a same implantation step, and/or performed using the same material.

The resulted second-doping-type well, e.g., the N-well 1002 illustrated in FIG. 3B, may function as the drift region of the LDMOS transistor structure.

The step S103 may include forming a diode component, e.g., a metal-containing element, on the second-doping-type well, such that the diode component and the second-doping-type well form a diode, e.g., a Schottky diode. For example, the diode component and the second-doping-type well may be the metal silicide element 105 and the N-well 1002, respectively, illustrated in FIG. 3C. An end portion of the silicide element, e.g., the top portion of the silicide element 105, may function as the drain electrode region 106 of the LDMOS transistor structure.

The method may further include forming one or more interlayer dielectric (ILD) elements and one or more contact holes, which may be formed in, for example, one or more of the structures illustrated in FIGS. 3A, 3B, and 3C. The ILD elements and contact holes may be implemented using known processes.

According to embodiments of the invention, a semiconductor device manufactured using a method that includes steps discussed with reference to FIGS. 3A, 3B, 3C, and 4 may include a diode (e.g., a Schottky diode) that is positioned at (e.g., overlaps) a drain electrode region of an LDMOS transistor structure of the semiconductor device and is in a reverse (or reverse-bias) series connection with the PN junction formed by a semiconductor substrate (e.g., a P-substrate) and a second-doping-type well (e.g., an N-type well) of the LDMOS transistor structure. The diode may effectively block an unwanted electric current from substantially flowing into the semiconductor substrate when the LDMOS transistor structure operates in an inductive load mode, such that the semiconductor device may function properly. Advantageously, desirable quality and/or performance of the semiconductor device may be achieved.

Figure 5:
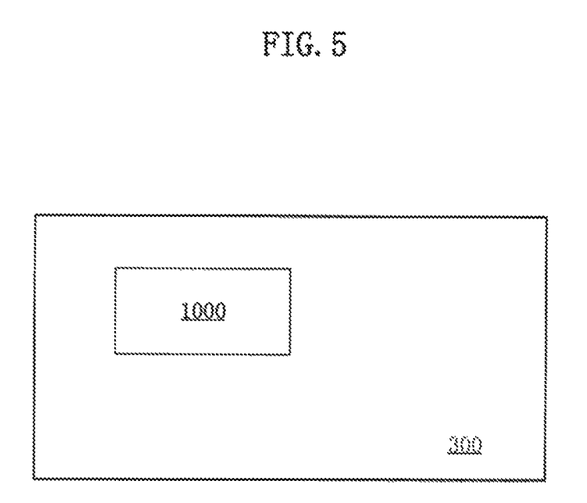
FIG. 5 shows a schematic diagram that illustrates an electronic device in accordance with an embodiment of the present invention.

FIG. 5 shows a schematic diagram that illustrates an electronic device 300 in accordance with an embodiment of the present invention. The electronic device 300 may include the semiconductor device 1000 discussed with reference to FIG. 2 and manufactured using one or more steps discussed with reference to FIGS. 3A, 3B, 3C, and 4 and/or may include a semiconductor device that includes elements (and/or structures) analogous to elements (and/or structures) of the semiconductor 1000.

In an embodiment, the electronic device 300 may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, and a portable game device.

In an embodiment, the electronic device 300 may be or may include an intermediate product or module that includes the semiconductor device 1000.

The semiconductor device 1000 (and/or a similar semiconductor device) in electronic device 300 may facilitate optimization of the performance of the electronic device 300.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A semiconductor device comprising:
   a first-type substrate;
   a second-type well configured to form a PN junction with the first-type substrate;
   a diode component configured to form a diode with the second-type well,
   wherein the diode is connected to the PN junction in a reverse series connection;
   a gate electrode of a transistor structure, wherein the diode component is positioned between two portions of the gate electrode;
   a second-type element configured to function as a source electrode of the transistor structure, wherein the diode component is positioned between two portions of the second-type element in a plan view of the semiconductor device; and
   a first-type element configured to function as a body electrode of the transistor structure, wherein the diode component is positioned between two portions of the first-type element in a plan view of the semiconductor device, the second-type element is positioned between the second-type well and the first-type element, and the first-type element and the second-type element are separated by a shallow trench isolation structure,
   wherein the second-type is N-type if the first-type is P-type, and
   wherein the second-type is P-type if the first-type is N-type.

2. The semiconductor device of claim 1, wherein the second-type well is positioned between the diode component and the first-type substrate.

3. The semiconductor device of claim 1, wherein the diode is a Schottky diode.

4. The semiconductor device of claim 1, wherein the diode component is at least one of metal-containing element and a metal silicide element.

5. The semiconductor device of claim 1, wherein an end portion of the diode component does not directly contact the second-type well and is configured to function as a drain electrode region of a transistor structure.

6. The semiconductor device of claim 1, further comprising a first-type ion implanted region positioned in the second-type well.

7. The semiconductor device of claim 6, wherein a portion of the second-type well is positioned between the first-type ion implanted region and a surface of the first-type substrate in a direction perpendicular to the surface of the first-type substrate.

8. The semiconductor device of claim 6, wherein a portion of the second-type well that overlaps the diode component is positioned between two portions of the first-type ion implanted region.

9. The semiconductor device of claim 6, wherein the first-type ion implanted region is positioned between two portions of the gate electrode in a plan view of the semiconductor device.

10. The semiconductor device of claim 6, wherein the first-type ion implanted region is positioned between two portions of the second-type element.

11. The semiconductor device of claim 6, wherein the first-type ion implanted region is positioned between two portions of the first-type element.

12. An electronic device comprising a semiconductor device, wherein the semiconductor device comprises:

a first-type substrate;
a second-type well configured to form a PN junction with the first-type substrate;
a diode component configured to form a diode with the second-type well,
wherein the diode is connected to the PN junction in a reverse series connection;
a gate electrode of a transistor structure, wherein the diode component is positioned between two portions of the gate electrode;
a second-type element configured to function as a source electrode of the transistor structure, wherein the diode component is positioned between two portions of the second-type element in a plan view of the semiconductor device; and
a first-type element configured to function as a body electrode of the transistor structure, wherein the diode component is positioned between two portions of the first-type element in a plan view of the semiconductor device, the second-type element is positioned between the second-type well and the first-type element, and the first-type element and the second-type element are separated by a shallow trench isolation structure,
wherein the second-type is N-type if the first-type is P-type, and
wherein the second-type is P-type if the first-type is N-type.

* * * * *